US012710486B2

(12) United States Patent
Worms et al.

(10) Patent No.: US 12,710,486 B2
(45) Date of Patent: Aug. 18, 2026

(54) SENSOR SYSTEM FOR DETECTING A MEDIUM

(71) Applicant: Robert Bosch GmbH, Stuttgart (DE)

(72) Inventors: Kai Worms, Hardthausen am Kocher (DE); Julian Kassel, Pforzheim (DE); Andreas Brenneis, Renningen (DE); Florian Mauch, Talheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 152 days.

(21) Appl. No.: 18/899,109

(22) Filed: Sep. 27, 2024

(65) Prior Publication Data

US 2025/0116734 A1 Apr. 10, 2025

(30) Foreign Application Priority Data

Oct. 9, 2023 (DE) ..................... 10 2023 209 790.7

(51) Int. Cl.
*G01R 33/032* (2006.01)
*G01R 33/00* (2006.01)

(52) U.S. Cl.
CPC ....... *G01R 33/032* (2013.01); *G01R 33/0047* (2013.01); *G01R 33/0076* (2013.01)

(58) Field of Classification Search
CPC .............. G01R 33/032; G01R 33/0047; G01R 33/0076
USPC .......................................................... 324/200
See application file for complete search history.

(56) References Cited

U.S. PATENT DOCUMENTS 11,733,321 B2 * 8/2023 Rosenfeld ............ G01R 33/323 600/409
2017/0234941 A1 * 8/2017 Hatano ................ G01R 33/032 324/304
2017/0343621 A1 * 11/2017 Hahn ................. G01R 33/1284
2020/0064419 A1 * 2/2020 Barry ................... G01R 33/323
2021/0103010 A1 4/2021 Rosenfeld

FOREIGN PATENT DOCUMENTS

DE 102018202588 A1 8/2019
DE 102020204732 A1 10/2021

* cited by examiner

*Primary Examiner* — Roberto Velez
(74) *Attorney, Agent, or Firm* — NORTON ROSE FULBRIGHT US LLP

(57) ABSTRACT

A magnetic field sensor for detecting a magnetic field. The sensor includes a magneto-optical material, an excitation light source configured to emit excitation radiation for exciting electronic states of the magneto-optical material, a microwave source configured to generate an electromagnetic field for feeding a resonator structure, a detector configured to detect fluorescent radiation that the magneto-optical material may emit as a result of irradiation with the excitation radiation, a magnetic field generating apparatus arranged and configured to generate a permanent magnetic field in the region of the magneto-optical material, a resonator structure, arranged on a dielectric, configured to shape the electromagnetic field emitted by the microwave source in such a way that a microwave field is created that is suitable for manipulating spin states of the magneto-optical material. The magneto-optical material, the excitation light source, the detector, and the microwave structure are arranged in an enclosed space.

15 Claims, 4 Drawing Sheets

1
12
5
3 2 29 28 11 18 9
7
33
15
16
8
41
6
6
4
20 17 14 27 30 31 25 10 24
32
13

1 12 29 28 3 2 5 8 11 9 36 37 38
16 26 15 34
20 14 17 10 35
27

SENSOR SYSTEM FOR DETECTING A MEDIUM

CROSS REFERENCE

The present application claims the benefit under 35 U.S.C. § 119 of German Patent Application No. DE 10 2023 209 790.7 filed on Oct. 9, 2023, which is expressly incorporated herein by reference in its entirety.

FIELD

The present invention relates to a magnetic field sensor based on an NV diamond.

BACKGROUND INFORMATION

For several years, diamond crystals whose crystal lattices contain defects in the form of NV centers have been the subject of research. In an NV center, a nitrogen atom occupies the lattice site of a carbon atom, wherein a defect is located in direct proximity to the nitrogen atom, again on the lattice site of a carbon atom. When such a crystal lattice is irradiated with excitation radiation having a wavelength between 490 nm and 575 nm, an electronic transition from a ground state $^3A_2$ to an excited state $^3E$ is induced. The NV center relaxes from the excited state $^3E$ back to the ground state $^3A_2$ by emitting fluorescent radiation in a wavelength range between 600 nm and 850 nm.

The ground state $^3A_2$ has three magnetic substates where $m_s=0$, $m_s=\pm1$. The states where $m_s=0$ and $m_s=\pm1$ differ by an energy difference of 2.87 GHZ (zero field splitting). The excited state $^3E$ also has three magnetic substates where $m_s=0$, $m_s=\pm1$. If the NV center now in the ground state $^3A_2$ is exposed to an alternating magnetic field with a frequency of 2.87 GHZ (usually and hereinafter, alternating magnetic fields in a frequency range between 1 and 4 GHz are referred to as a "microwave field"), the NV center oscillates between the $m_s=0$, $^3A_2$ ground state and the $m_s=\pm1$, $^3A_2$ ground state. When irradiated with the excitation radiation, the NV center is now partially shifted from the $m_s=\pm1$, $^3A_2$ ground state to the excited $m_s=\pm1$, $^3E$ state. From there it relaxes back to its ground state, mostly without radiation. If the intensity of the fluorescent radiation is measured as a function of the frequency of the microwave field, a sudden drop in the intensity of the fluorescent radiation (known as a peak) occurs at a frequency of 2.87 GHZ. The decrease in the intensity of the fluorescent radiation can be explained by the fact that, when the microwave field is irradiated with a frequency of 2.87 GHZ, there are fewer NV centers in the $m_s=0$, $^3A_2$ ground state that are optically excited and can relax into the $m_s=\pm1$, $^3A_2$ ground state by emitting fluorescent radiation.

In an external magnetic field, the $m_s=\pm1$, $^3A_2$ ground state splits into two states with the spin quantum numbers $m_s=1$ and $m_s=-1$ (Zeemann effect). If the intensity of the fluorescent radiation is measured while the frequency of the microwave field is varied, two peaks are obtained. The frequencies at which these peaks occur depend on the magnitude of the splitting of the $m_s=\pm1$, $^3A_2$ ground state and thus on the field strength of the external magnetic field.

Such a magnetic field sensor is described, for example, in German Patent Application No. DE 10 2020 204 732. Here, the excitation radiation is generated by means of a laser diode arranged in a cavity. The cavity is formed by a recess in a carrier wafer and a glass substrate that hermetically seals the cavity. The excitation radiation is guided through the glass substrate to a lower level where it is focused onto an NV diamond. The lower level has a substrate on which the rest of the system components, such as the diamond, a radio frequency device, photodetectors and other optical components are arranged. The substrate is closed with a cap substrate that contains an opening through which the excitation radiation can reach the diamond. The laser diode is thus arranged in its own enclosed space, separate from the other components of the magnetic field sensor. Such a magnetic field sensor having two separate cavities takes up a lot of space and cannot be further miniaturized. In addition, the alternating magnetic field generated by the high-frequency device can propagate freely, so that the characteristics of the high-frequency device are influenced by materials in the vicinity of the magnetic field sensor. This may affect the specification of the magnetic field sensor and thus prevent the magnetic field sensor from being universally applicable. In addition, components arranged outside the magnetic field sensor can be disturbed by the alternating magnetic field and the electromagnetic compatibility of the magnetic field sensor can be limited.

It is an object of the present invention to provide a magnetic field sensor that does not have the disadvantages of the related art.

SUMMARY

The present invention relates to a magnetic field sensor for detecting a magnetic field. Advantageous embodiments of the present invention are disclosed herein.

The present invention provides a magnetic field sensor for detecting a magnetic field. According to an example embodiment of the present invention, the magnetic field sensor includes a magneto-optical material, an excitation light source, a microwave source and a detector. The magneto-optical material can be diamond crystals whose crystal lattice has defects in the form of NV centers. The excitation light source is designed to emit excitation radiation to excite electronic states of the magneto-optical material. The excitation light source can be a laser diode with a wavelength between 490 nm and 575 nm. The microwave source is designed to generate an electromagnetic field that can feed a resonator structure, i.e. can be supplied to a resonator structure. The detector is designed to detect fluorescent radiation that the magneto-optical material may emit as a result of irradiation with the excitation radiation. Furthermore, the magnetic field sensor has a magnetic field generating apparatus that is arranged and designed to generate a permanent magnetic field in the region of the magneto-optical material.

The resonator structure is arranged on a dielectric and designed to amplify the electromagnetic field generated by the microwave source at least in a predefined frequency band and to shape it in such a way that a homogeneous microwave field can form in the region of the magneto-optical material. The microwave field thus generated is suitable for manipulating spin states of the magneto-optical material and has, for example, one or more frequencies in a frequency band between 2.5 GHZ and 3 GHZ.

The deposition of organic substances on the optical components, in particular on the excitation light source, is problematic. In order to protect the magneto-optical material, the excitation light source, the detector and the resonator structure from this and other environmental influences, they are arranged in an enclosed space. The magneto-optical material, the excitation light source and the detector can also be arranged on the dielectric. Arranging the magneto-optical material, the excitation light source, the detector and the resonator structure in an enclosed, in particular hermetically sealed, space makes it possible to design the magnetic field sensor compactly. In addition, the spatial proximity of the resonator structure to the magneto-optical material allows the microwave field amplified and shaped by the resonator structure to be efficiently coupled into the magneto-optical material with virtually no loss.

In this case, a first metal layer can be arranged below the resonator structure arranged on the dielectric and a second metal layer can be arranged above the resonator structure arranged on the dielectric. The first and the second metal layer are in particular designed to shield the microwave field amplified and shaped by the resonator structure from an upper side and a lower side of the enclosed space. In addition, the first and/or the second metal layer is designed to shape the microwave field amplified by the resonator structure.

In this way, both the microwave field can be shielded from the environment of the enclosed space and the electronic and optical components of the magnetic field sensor can be protected from environmental conditions.

The first and/or second metal layer is in particular designed as a ground plane that is connected to an electrical ground of the microwave source. The wave impedance, shape and propagation speed of the microwave electromagnetic field are influenced by, among other things, the material of the dielectric and by the position of the first and/or second metal layer connected to the ground.

According to an example embodiment of the present invention, the resonator structure can comprise an electrically conductive structure arranged on the dielectric and designed, for example, as an omega resonator, as a planar slot waveguide structure or as a loop-gap resonator. The resonator structure forms a resonator together with the dielectric on which it is arranged and the first and/or second metal layer designed as a ground plane. The wave impedance, shape and propagation speed of the microwave electromagnetic field are determined by, among other things, the material of the dielectric and the position of the first and second metal layer connected to the ground. In this case, the geometry of the resonator is chosen such that the microwave field is generated in such a way that it is homogeneous in a region in which the magneto-optical material is arranged, and is locally limited to this region. In this case, the resonator is in particular designed to amplify frequencies in one or more frequency bands in the range between 2.5 and 3.1 GHZ. Outside these frequency bands, the efficiency of field generation may drop so much that the power of the microwave source is no longer sufficient for meaningful operation of the magnetic field sensor.

Compared to a commonly used current-carrying wire that is brought close to the magneto-optical material, the use of the resonator structure has the advantage that a microwave field can be generated very efficiently. Accordingly, the microwave source can be of lower power and can be of a smaller size so that the magnetic field sensor can have a compact design.

According to a further development of the present invention, a base surface and four side surfaces are formed on a housing, in particular a one-piece housing, wherein the housing has a dielectric at least on the base surface and the resonator structure is arranged on the base surface. A separate cover is provided to close the housing, a ceiling surface being provided on the side of said cover facing the components of the magnetic field sensor. In this further development of the present invention, the four side surfaces, the base surface and the ceiling surface form the enclosed space. The housing can be constructed entirely or partially from a dielectric, for example a dielectric plastics material. The use of a housing facilitates the production of the magnetic field sensor, because such a housing, known as a package, is easy and inexpensive to obtain.

According to a further development of the present invention, the magnetic field sensor has a closure, in particular a one-piece closure, wherein the ceiling surface and the four side surfaces are formed on the closure. In this case, the base surface can be formed on a first dielectric substrate. The resonator structure is arranged in particular on the base surface, in this case on the first dielectric substrate. The first dielectric substrate comprises a dielectric or is formed entirely or partially from a dielectric, for example a dielectric plastics material. In this further development of the present invention, the four side surfaces, the base surface and the ceiling surface also form the enclosed space. Such a closure is also easy and inexpensive to obtain, so that such a magnetic field sensor is easy and inexpensive to produce.

According to a further development of the present invention, the housing or the first dielectric substrate is arranged on a printed circuit board. In this case, a gap can be arranged between the printed circuit board and the housing or between the printed circuit board and the first dielectric substrate. The gap can be filled with air or a dielectric material. Arranging the housing or the first dielectric substrate on the printed circuit board allows easy contacting of the components of the magnetic field sensor that are arranged in the enclosed space, as well as easy installation of the magnetic field sensor.

The thickness of the gap can affect the wave impedance of the resonator as well as the propagation speed of the microwave field, which in turn affects the resonant frequency. Even a small variation in the thickness of the gap can change the resonant frequency significantly, up to a resonant frequency at which the magnetic field sensor can no longer be operated effectively.

The housing or the first dielectric substrate can also be arranged directly on the printed circuit board. This allows for simple and cost-effective production of the magnetic field sensor.

According to a further development of the present invention, the resonator structure is surrounded by a third metal layer also arranged on the dielectric. The third metal layer can be arranged such that the resonator structure is completely or partially surrounded by the third metal layer toward the four side surfaces. In this case, the third metal layer can be connected to the electrical ground of the microwave source. The sensitivity of the resonant frequency to the gap thickness can be reduced by arranging the third metal layer on the dielectric around the resonator structure.

According to a further development of the present invention, the resonator structure is arranged on a side of the first dielectric substrate facing the enclosed space and the first metal layer is arranged on an opposite side of the first dielectric substrate. In particular, the first dielectric substrate is arranged in the housing, wherein the first metal layer is arranged on the side of the first dielectric substrate facing the base surface of the housing, and the resonator structure is arranged on the side of the dielectric substrate facing away from the base surface of the housing (and thus facing the enclosed space). In this further development of the present invention, the side of the dielectric substrate facing away from the base surface, the four side walls and the ceiling surface formed on the cover form the enclosed space. In this case, the first dielectric substrate can consist entirely or partially of a dielectric, for example a dielectric plastics material. Such a design allows for simple installation and thus a cost-effective design of the magnetic field sensor.

In a further development of the present invention, the second metal layer is arranged on a second dielectric substrate. In this case, the second dielectric substrate is arranged in particular on the ceiling surface of the cover, wherein the second metal layer is arranged on the side of the second dielectric substrate that faces away from the ceiling surface (and thus faces the enclosed space). Additionally or alternatively, a fourth metal layer can be arranged opposite the second metal layer and thus on the side of the second dielectric substrate that faces the ceiling surface. Such a design allows for simple installation and thus a cost-effective design of the magnetic field sensor.

In a further development of the present invention, the first metal layer is designed as a cooling block. This allows for a particularly compact design of the magnetic field sensor because an additional cooling block or an additional metal layer is not required.

In a further development of the present invention, a fifth metal layer is arranged parallel to one of the side surfaces of the enclosed space. This improves the shielding of the microwave field amplified by the resonator structure. The fifth metal layer can be electrically connected to the second and/or first metal layer and/or further metal layers, for example by contacts.

The resonator structure can be produced using a laser, for example by means of laser structuring. This allows the resonator structure to be produced easily, accurately and cost-effectively.

Further advantages and embodiments of the present invention can be found in the description and the figures.

The present invention is shown schematically in the figures on the basis of exemplary embodiments and is described below with reference to the figures.

DETAILED DESCRIPTION OF EXAMPLE EMBODIMENTS

Figures 1, 2:
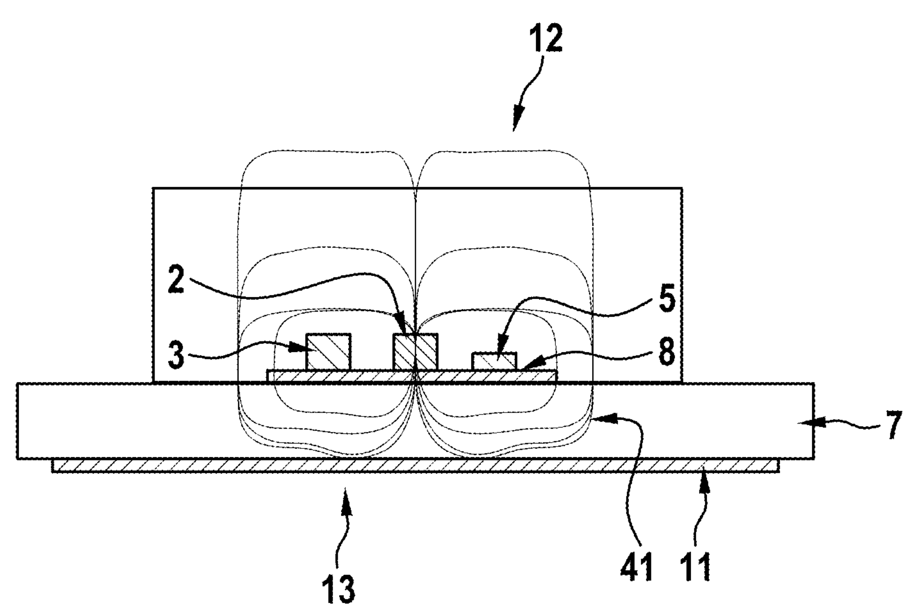
FIG. 1 shows a magnetic field sensor according to an exemplary embodiment of the present invention, in which a magneto-optical material, an excitation light source, a detector and a resonator structure are arranged on a dielectric in an enclosed space.
FIG. 2 shows a further exemplary embodiment of a magnetic field sensor according to the present invention, in which the magneto-optical material, the excitation light source, the detector and the resonator structure are arranged on a base surface of a housing and wherein a metal layer is arranged below the base surface of the housing.

FIG. 1 shows a magnetic field sensor 1, wherein a magneto-optical material 2, for example a diamond having NV defects, as well as an excitation light source 3, for example designed as a laser diode, and a detector 5 are arranged on a dielectric 7. A resonator structure 8 is also arranged on the dielectric. Said resonator structure is designed to amplify and shape an alternating electromagnetic field generated by a microwave source in a predefined frequency band, so that a homogeneous microwave field is formed in the region of the magneto-optical material 2. In FIG. 1, field lines of the microwave field 41 can be seen. A first metal layer 11 can be arranged on the lower side of the dielectric 7. In this case, the excitation light source 3, the magneto-optical material 2 and the detector 5 are arranged in an enclosed space.

The excitation light source 3 is designed to emit excitation radiation with a wavelength between 490 nm and 575 nm. When the magneto-optical material 2 is irradiated with the excitation radiation, an electronic state of the magneto-optical material 2 can be excited, which relaxes back to the ground state by emitting fluorescent radiation. If the spin states of the magneto-optical material 2 are simultaneously excited by the microwave field of a suitable frequency, e.g. 2.87 MHz, the intensity of the emitted fluorescent radiation is reduced because the ground state from which the excitation to an excited state occurs is occupied with a lower probability. The intensity of the fluorescent radiation can be detected by the detector 5.

With the aid of a microwave source, an alternating electromagnetic field is generated that is amplified and shaped by the resonator structure 8 arranged on the dielectric 7, so that a microwave field 41 is present where the magneto-optical material 2 is arranged. The first metal layer 11 limits the microwave field 41 downward 13, but not upward 12, so that it can propagate freely upward. This means that the characteristics of the microwave field 41 generated by the resonator structure 8 can be influenced by the environment of the magnetic field sensor 1 and that the magnetic field sensor 1 cannot be used universally. Furthermore, components arranged outside the magnetic field sensor 1 can also be disturbed by the generated microwave field 41, so that such a magnetic field sensor 1 does not meet the requirements with regard to electromagnetic compatibility.

In addition, the optical and electro-optical components 2, 3, 5, 8 of the magnetic field sensor 1 are exposed to environmental conditions. This is in particular problematic for the excitation light source 3. If said excitation light source is designed as a laser diode, the facet of the laser diode is particularly sensitive to organic deposits.

FIG. 2 shows a magnetic field sensor according to an exemplary embodiment of the present invention. The resonator structure 8, the magneto-optical material 2, for example a diamond crystal having NV defects, the excitation light source 3, for example a laser diode, and a detector 5 are arranged on a base surface 14 of a housing 17. The housing 17 further has four side surfaces, of which two side surfaces 15, 16 are shown in FIG. 2, and the base surface 14. The housing 17 can be formed in one piece and have a dielectric 7 at least on the base surface 14. The housing 17 can also consist completely or almost completely of a dielectric 7. The resonator structure 8 can be arranged directly on the base surface 14, in particular directly on the dielectric 7.

A first metal layer 10 can be arranged below the base surface 14 of the housing 17, and thus below the resonator structure 8, in particular parallel to the base surface 14. A second metal layer 11 can be arranged above the resonator structure 8, in particular on a side of a ceiling surface 18 facing the components of the magnetic field sensor 2, 3, 5, 8. A microwave field 41 is formed that is shielded by the first and second metal layers 10, 11 from an upper side 12 and a lower side 12 of an enclosed space 9 that is formed by the ceiling surface 18, the four side walls 15, 16 and the base surface 14. It is understood that only a single metal layer (10, 27, 30) can be arranged below the base surface 14 of the housing 17, wherein sufficient shielding and shaping of the microwave field can be achieved by the provision of said single metal layer.

The ceiling surface 18 is formed on a cover 33, so that the cover 33 and the housing 17 close off the enclosed space 9 to the outside, in which enclosed space the excitation light source 3, the detector 5, as well as the electromagnetic material 2 and the resonator structure 8 are arranged. In this way, the excitation light source 3 and the detector 5 are protected from environmental influences, such as contamination. At the same time, the resonator structure 8 can be arranged in close proximity to the magneto-optical material 2, so that the microwave field generated by the resonator structure 8 can be transmitted into the magneto-optical material 2 without loss or almost without loss.

As shown in FIG. 2, the resonator structure 8 can also be surrounded by a third metal layer 20 that is arranged on the base surface 14. The housing 17 can be arranged on a printed circuit board 24, in particular the housing 17 can be soldered onto the printed circuit board 24. In this case, a gap 25 forms between the printed circuit board 24 and the housing 17. The gap 25 can be filled with air or with a preferably dielectric material. If the metal layers 10 and 27 are missing, the thickness of the gap 25 between the housing 17 and the printed circuit board 24 influences the wave impedance of the resonator formed by the resonator structure 8, the dielectric 7 and the first and second metal layers 11, 30, as well as the propagation speed of the wave that is formed and thus the resonant frequency of the resonator. Providing the third metal layer 20 can reduce the sensitivity of the resonant frequency to a variation in the thickness of the gap 25.

Below the first metal layer 10 or as an alternative to the first metal layer 10, one or more further metal layers 27 can be provided in the housing 17, in particular parallel to the base surface 14 of the housing 17. The metal layer(s) 27 can alternatively or additionally be attached to an outer side of the housing 17. Likewise, above the second metal layer 11 or as an alternative to the second metal layer 11, further metal layers 28, 29 can be arranged in the cover 33, in particular parallel to the base surface 14 and/or to the ceiling surface 18, or on a side of the cover 33 facing away from the components of the sensor 2, 3, 5, 8, i.e. on an outer side of the cover 33.

Metal layers 30, 31, 32 can also be provided on the printed circuit board 24. These metal layers 30, 32, 32 can be arranged on one or both sides and/or in the printed circuit board 24. The microwave source 4, which is connected to the resonator structure 8, and the magnetic field generating apparatus 6 can also be arranged on the printed circuit board 24. In this case, the magnetic field generating apparatus 6 can comprise a Helmholtz coil and/or one or more permanent magnets that generate a permanent magnetic field in the region of the magneto-optical material 2.

The metal layers 10, 11, 27, 28, 29, 30, 31, 32 can be designed as ground planes, wherein they are connected to the electrical ground of the microwave source 4.

Figure 3:
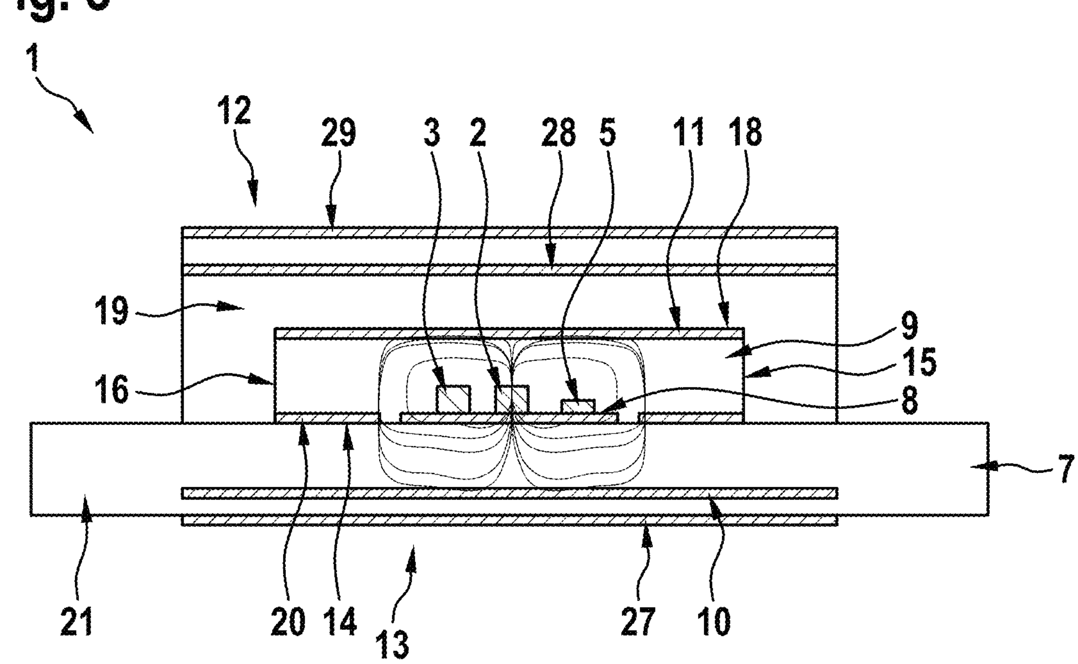
FIG. 3 also shows a further exemplary embodiment of a magnetic field sensor according to the present invention, wherein the magneto-optical material, the excitation light source, the detector and the resonator structure are arranged on a first dielectric substrate.

FIG. 3 shows a further exemplary embodiment of the magnetic field sensor 1. In contrast to the exemplary embodiment of FIG. 2, the four side surfaces 15, 16 and the ceiling surface 18 of the enclosed space 9, in which the excitation light source 3, the detector 5, the magneto-optical material 2 and the resonator structure 8 are arranged, are formed on a closure 19. The base surface 14 is formed on a first dielectric substrate 21. The first dielectric substrate 21 has a dielectric 7. The closure 19 is arranged directly on the first dielectric substrate 21. As in the exemplary embodiment according to FIG. 2, the excitation light source 3, the detector 5, the resonator structure 8, the magneto-optical material 2 and the third metal layer 20 are arranged on the base surface 14. The third metal layer 20 surrounds the resonator structure 8.

The first metal layer 10 can be arranged in the dielectric substrate 21. The second metal layer 11 can be arranged on the ceiling surface 18 of the closure 17 so that it faces the components 2, 3, 5, 8 of the magnetic field sensor 1. Further metal layers 28, 29 are arranged in or on the closure 17, for example parallel to the ceiling surface 18. The dielectric substrate 21 can be arranged on a printed circuit board 24 (not shown in FIG. 3) analogously to the embodiment described in connection with FIG. 2.

Figure 4:
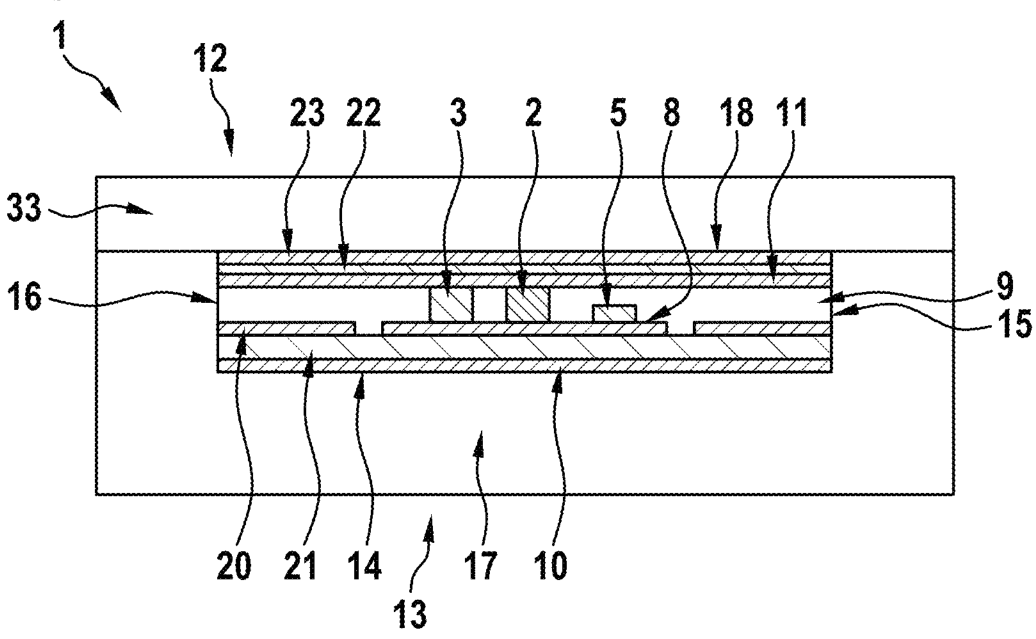
FIG. 4 also shows a further exemplary embodiment of a magnetic field sensor according to the present invention, wherein the magnetic field sensor has a second dielectric substrate in addition to the first dielectric substrate.

FIG. 4 shows a further embodiment of the magnetic field sensor 1 according to the present invention. Herein, the first dielectric substrate 21 and a second dielectric substrate 22 are arranged in the housing 17. In this case, the first metal layer 10 is arranged on the base surface 14 of the housing 17 and the first dielectric substrate 21 is arranged on the first metal layer 10. The resonator structure 8 and optionally also the third metal layer 20 are arranged on the first dielectric substrate 21.

A fourth metal layer 23 is arranged on the ceiling surface 18 of the cover 33 within the enclosed space 9, the second dielectric substrate 22 being arranged on the side of said fourth metal layer facing the enclosed space 9. The second metal layer 11 is arranged on the side of the second dielectric substrate 22 facing the enclosed space 9. In this embodiment, the dielectric 7 is formed by the first dielectric substrate 21. The housing 17 can be arranged on a printed circuit board 24 (not shown in FIG. 4) analogously to the embodiment described in connection with FIG. 2.

Figures 5, 6:
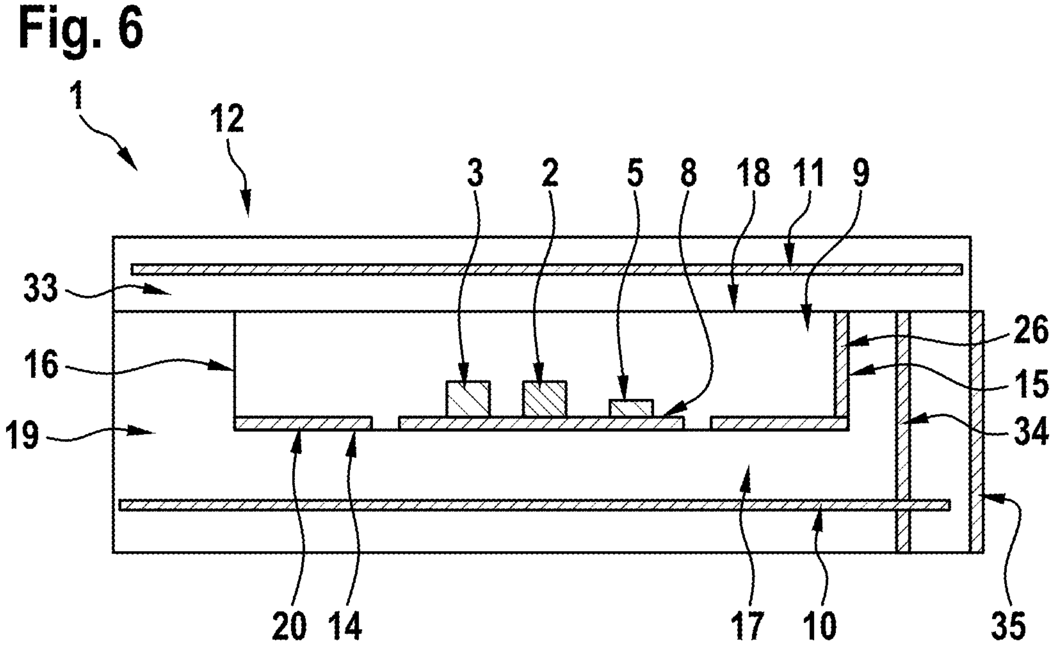
FIG. 5 shows a further exemplary embodiment of the magnetic field sensor according to the present invention, wherein a metal layer is provided that is designed as a cooling block.
FIG. 6 shows a further exemplary embodiment of the magnetic field sensor according to the present invention, wherein the magnetic field sensor has metal layers on its side surfaces.

FIG. 5 shows a further exemplary embodiment of the magnetic field sensor 1. As in the embodiment according to FIG. 2, the resonator structure 8, the excitation light source 3, the detector 5 and the magneto-optical material 2 are arranged on the base surface 14 of the housing 17. The third metal layer 20 can also be arranged on the base surface 14 of the housing 17. The second metal layer 11 is arranged on the ceiling surface 18 of the cover 33. The first metal layer 10 is arranged below the base surface 14 in the housing 17, in particular parallel to the base surface 14, and is designed as a cooling block 25. The cooling block 25 can be formed from an electrically conductive material. The cooling block 25 can be connected to the electrical ground of the microwave source 4 and serve as a shield and/or as a ground plane. In this exemplary embodiment too, the housing 17 can be arranged on a printed circuit board 24 (not shown in FIG. 5) analogously to the embodiment described in connection with FIG. 2.

FIG. 6 shows a further exemplary embodiment of the magnetic field sensor 1. Herein, the resonator structure 8, the excitation light source 3, the detector 5 and the magneto-optical material 2 are once again arranged on the base surface 14 of the housing 17. The third metal layer 20 can also be arranged on the base surface 14 of the housing 17. The second metal layer 11 is arranged in or on the cover 33, in particular parallel to the ceiling surface 18. The first metal layer 10 is arranged below the base surface 14 in the housing 17, in particular parallel to the base surface 14. A fifth metal layer 26 is arranged on at least one of the side surfaces 15, 16. Further metal layers 34, 35 can be arranged in the housing 17 or the closure 19 or on an outer side of the housing 17 or the closure 19, in each case parallel to one of the side surfaces 15, 16. The metal layers 26, 34, 35 further shield the microwave field from the environment of the magnetic field sensor 1. In this exemplary embodiment too, the housing 17 can be arranged on a printed circuit board 24 (not shown in FIG. 6) analogously to the embodiment described in connection with FIG. 2.

Figures 7, 8:
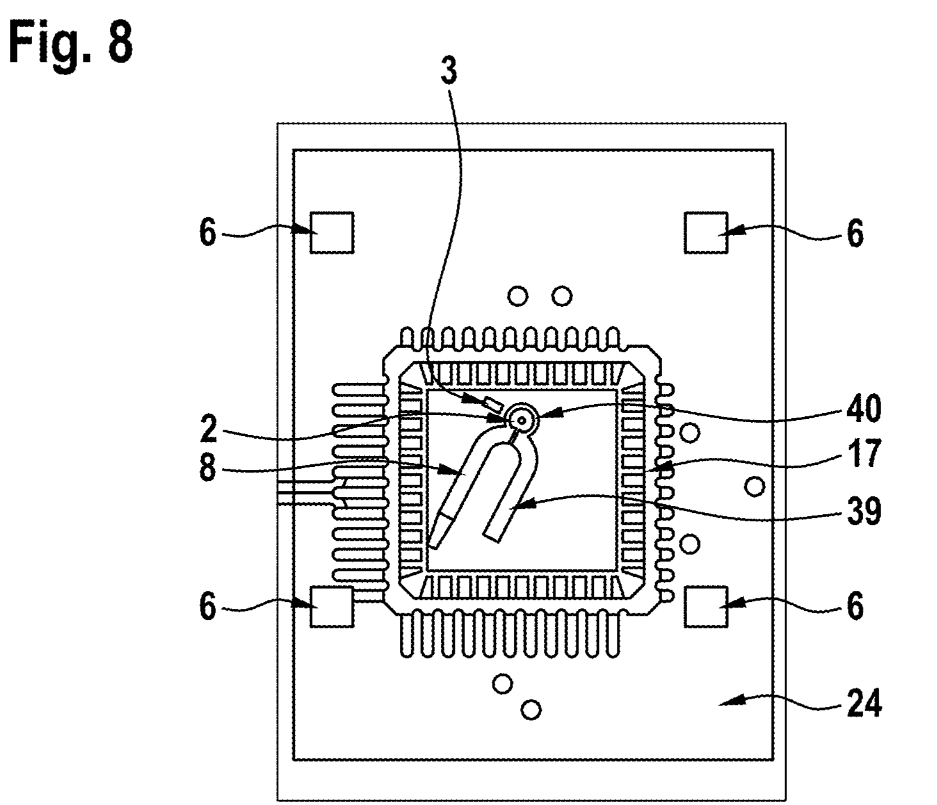
FIG. 7 shows a further exemplary embodiment of the magnetic field sensor according to the present invention, wherein the metal layers on the side surfaces are connected to the metal layers on the base surface and a ceiling surface.
FIG. 8 is a plan view of an example embodiment of the magnetic field sensor, according to the present invention.

FIG. 7 shows a further exemplary embodiment of the magnetic field sensor 1. The exemplary embodiment of FIG. 7 corresponds to the exemplary embodiment of FIG. 6, wherein the metal layers 26, 34, 35 arranged parallel to one of the side surfaces 15, 16 are connected to the metal layers 10, 27 extending in parallel with the base surface 14 and arranged on or in the housing 17 and/or to the metal layers 11, 28, 29 arranged on or in the cover 33. The metal layers 26, 34, 35 arranged parallel to one of the side surfaces 15, 16 can be conductively connected by contacts 36, 37, 38 to the metal layers 11, 28, 29 extending in or on the cover 33.

It is understood that even in an embodiment in which the side surfaces 15, 16 and the ceiling surface 17 are formed on a closure 19 and the base surface 14 is formed on a dielectric substrate 21, metal layers 26, 34, 35 arranged parallel to one of the side surfaces 15, 16, in this case in the closure 19, can be provided. The metal layers 26, 34, 35 arranged parallel to one of the side surfaces 15, 16 can also be electrically conductively connected to the metal layers 10, 27 arranged in or on the dielectric substrate 21 and/or the metal layers 11, 28, 29 extending in parallel with the ceiling surface 18 and arranged in or on the closure 19. In this case, the electrical connection of the metal layers 10, 27 arranged in or on the dielectric substrate 21 to the metal layers 26, 34, 35 arranged parallel to one of the side surfaces 15, 16 is made via the contacts 36, 37, 38.

FIG. 8 is a plan view of an embodiment of the magnetic field sensor 1. The resonator structure 8, the excitation light source 3 and the magneto-optical material 2 are arranged on the base surface 14 of the housing 17. The cover 33, which together with the housing 17 closes off the enclosed space to the outside, is not shown in FIG. 8. The resonator structure 8 has a horseshoe-shaped first part 39 and an annular second part 40, wherein both the horseshoe-shaped first part 39 and the annular second part 40 have a slot, at the respective edges of which the two parts 39, 40 are connected to one another. The magneto-optical material 2, in this case the diamond having NV defects, is arranged in the center of the annular second part 40. The housing 17 is arranged on a printed circuit board 24. Also arranged on the circuit board 24 is the magnetic field generating apparatus 6, which is designed as an arrangement of four permanent magnets.

What is claimed is:

1. A magnetic field sensor, comprising:

a magneto-optical material;

an excitation light source configured to emit excitation radiation for exciting electronic states of the magneto-optical material;

a microwave source configured to generate an electromagnetic field for feeding a resonator structure;

a detector configured to detect fluorescent radiation that the magneto-optical material may emit as a result of irradiation with the excitation radiation;

a magnetic field generating apparatus arranged and configured to generate a permanent magnetic field in a region of the magneto-optical material; and the resonator structure arranged on a dielectric, the resonator structure being configured to shape the electromagnetic field emitted by the microwave source in such a way that a microwave field is created that is suitable for manipulating spin states of the magneto-optical material;

wherein the magneto-optical material, the excitation light source, the detector, and the microwave structure are arranged in an enclosed space.

2. The magnetic field sensor according to claim 1, wherein: (i) a first metal layer is arranged below the resonator structure arranged on the dielectric, and/or (ii) a second metal layer is arranged above the resonator structure arranged on the dielectric, and wherein the first and/or second metal layer are configured to shield the microwave field emanating from the microwave structure from an upper side and a lower side of the enclosed space.

3. The magnetic field sensor according to claim 2, wherein the first and/or the second metal layer is formed as a ground plane that is connected to a ground of the microwave source.

4. The magnetic field sensor according to claim 2, wherein the second metal layer is arranged on a second dielectric substrate.

5. The magnetic field sensor according to claim 4, wherein a fourth metal layer is arranged on the second dielectric substrate, opposite the second metal layer.

6. The magnetic field sensor according to claim 5, wherein a gap filled with air or a dielectric material, is arranged between the printed circuit board and: (i) the housing or (ii) the first dielectric substrate.

7. The magnetic field sensor according to claim 2, wherein the first metal layer is configured as a cooling block.

8. The magnetic field sensor according to claim 7, wherein the fifth metal layer electrically connects a first metal layer to a second metal layer.

9. The magnetic field sensor according to claim 1, wherein a base surface and four side surfaces of the enclosed space are formed on a housing, wherein the housing has a dielectric at least on the base surface.

10. The magnetic field sensor according to claim 9, wherein a ceiling surface and the four side surfaces of the enclosed space are formed on a closure, and wherein the base surface is formed on a first dielectric substrate.

11. The magnetic field sensor according to claim 10, wherein the resonator structure is arranged on the first dielectric substrate, opposite a first metal layer.

12. The magnetic field sensor according to claim 10, wherein the housing or the first dielectric substrate is arranged on a printed circuit board.

13. The magnetic field sensor according to claim 9, wherein the resonator structure is arranged on the base surface of the enclosed space.

14. The magnetic field sensor according to claim 9, wherein a fifth metal layer is arranged parallel to one of the side surfaces of the enclosed space.

15. The magnetic field sensor according to claim 1, wherein the resonator structure is surrounded by a third metal layer which is also arranged on the dielectric.

* * * * *